(12) United States Patent
Keller et al.

(10) Patent No.: US 9,710,593 B1
(45) Date of Patent: Jul. 18, 2017

(54) METHODS, SYSTEMS, AND ARTICLES OF MANUFACTURE FOR ENHANCING TIMING ANALYSES WITH REDUCED TIMING LIBRARIES FOR ELECTRONIC DESIGNS

(71) Applicant: CADENCE DESIGN SYSTEMS, INC., San Jose, CA (US)

(72) Inventors: Igor Keller, Pleasanton, CA (US); Mikhail Chetin, San Jose, CA (US); Xiaojun Sun, Salt Lake City, UT (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/883,482

(22) Filed: Oct. 14, 2015

(51) Int. Cl.
*G06F 17/50* (2006.01)

(52) U.S. Cl.
CPC .............................. *G06F 17/5081* (2013.01)

(58) Field of Classification Search
CPC ............ G06F 17/5068; G06F 2217/84; G06F 17/5031; G06F 17/5072; G06F 17/5036; G06F 17/5022; G06F 17/5077; G06F 17/5081; G06F 17/5045; G06F 2217/78; G06F 17/505; G06F 17/5059; G06F 17/50
USPC ................... 716/100–106, 136–139
See application file for complete search history.

(56) References Cited

U.S. PATENT DOCUMENTS

| | | | |
|---|---|---|---|
| 7,359,843 B1 | 4/2008 | Keller et al. | |
| 7,464,349 B1 | 12/2008 | Keller et al. | |
| 7,562,323 B1 | 7/2009 | Bai et al. | |
| 7,761,826 B1 | 7/2010 | Thanvantri et al. | |
| 7,882,471 B1 | 2/2011 | Kariat et al. | |
| 7,983,891 B1 | 7/2011 | Keller | |
| 8,104,006 B2 | 1/2012 | Kariat et al. | |
| 8,245,165 B1 | 8/2012 | Tiwary et al. | |
| 8,302,046 B1 | 10/2012 | Keller et al. | |
| 8,341,572 B1 | 12/2012 | Tiwary et al. | |
| 8,375,343 B1 | 2/2013 | Tiwary et al. | |
| 8,516,420 B1 | 8/2013 | Kariat et al. | |
| 8,533,644 B1 | 9/2013 | Kariat et al. | |
| 8,543,954 B1 | 9/2013 | Keller et al. | |
| 8,595,669 B1 | 11/2013 | Keller et al. | |
| 8,601,420 B1 | 12/2013 | Keller et al. | |
| 8,615,725 B1 | 12/2013 | Keller et al. | |
| 8,631,369 B1 | 1/2014 | Kariat et al. | |
| 8,726,211 B2 | 5/2014 | Phillips et al. | |
| 8,782,583 B1 | 7/2014 | Tiwary et al. | |
| 8,839,167 B1 * | 9/2014 | Dreibelbis | G06F 17/5031 716/108 |

(Continued)

*Primary Examiner* — Binh Tat
(74) *Attorney, Agent, or Firm* — Vista IP Law Group, LLP

(57) ABSTRACT

Disclosed are techniques for enhancing timing analyses with reduced timing libraries for electronic designs. These techniques determine dominance relations for multiple timing models for timing analyses and generate a dominance adjacency data structure based at least in part upon the dominance relations. The dominance adjacency data structure may be stored at a first location of a non-transitory computer accessible storage medium. The plurality of timing models may be reduced into a reduced set of timing models at least by providing the dominance adjacency data structure as an input to a transformation and further by transforming the dominance adjacency data structure with the transformation into the reduced set of timing models that are used in timing analyses for an electronic design or a portion thereof.

20 Claims, 16 Drawing Sheets

(56) References Cited

U.S. PATENT DOCUMENTS

| | | |
|---|---|---|
| 8,924,905 B1 | 12/2014 | Keller et al. |
| 8,938,703 B1 | 1/2015 | Saurabh et al. |
| 8,966,421 B1 | 2/2015 | Kariat et al. |
| 9,003,342 B1 | 4/2015 | Keller et al. |
| 9,129,078 B1 | 9/2015 | Keller et al. |
| 9,384,310 B1 | 7/2016 | Keller et al. |
| 2010/0031209 A1* | 2/2010 | Luan ................... G06F 17/5031 716/113 |
| 2012/0324410 A1* | 12/2012 | Sripada ............... G06F 17/5031 716/113 |

* cited by examiner

```
┌─────────────────────────────────────────────────────────────┐
│ 204  GENERATE A DOMINANCE ADJACENCY MATRIX WITH THE PLURALITY OF │
│ TIMING MODELS BASED IN PART OR IN WHOLE UPON THE DOMINANCE  │
│ RELATIONS                                                    │
└─────────────────────────────────────────────────────────────┘
                              │
                              ▼
┌─────────────────────────────────────────────────────────────┐
│ 302A  IDENTIFY A PLURALITY OF TABLES FROM THE PLURALITY OF TIMING │
│ MODELS                                                       │
└─────────────────────────────────────────────────────────────┘
                              │
                              ▼
┌─────────────────────────────────────────────────────────────┐
│ 304A  GENERATE A 1ST MATRIX ACCORDING TO THE PLURALITY OF TIMING │
│ MODELS                                                       │
└─────────────────────────────────────────────────────────────┘
                              │
                              ▼
┌─────────────────────────────────────────────────────────────┐
│ 306A  SET THE DIAGONAL ENTRIES OF THE 1ST MATRIX TO "1S"    │
└─────────────────────────────────────────────────────────────┘
                              │
                              ▼
┌─────────────────────────────────────────────────────────────┐
│ 308A  IDENTIFY WAVEFORM TABLE ENTRIES CORRESPONDING TO A VOLTAGE │
│ VALUE IN THE 1ST & 2ND TIMING MODELS                        │
└─────────────────────────────────────────────────────────────┘
                              │
                              ▼
                        ┌──────────┐
                        │   310A   │
                        └──────────┘
```

FIG. 3A

|  | i = 1 | i = 2 | i = 3 | i = 4 | i = 5 | i = 6 |
|---|---|---|---|---|---|---|
| i = 1 | 1 | 1 | 0 | 1 | 0 | 0 |
| i = 2 | 0 | 1 | 0 | 0 | 1 | 0 |
| i = 3 | 1 | 0 | 1 | 0 | 0 | 0 |
| i = 4 | 1 | 0 | 0 | 1 | 0 | 0 |
| i = 5 | 0 | 0 | 0 | 0 | 1 | 0 |
| i = 6 | 0 | 0 | 1 | 0 | 0 | 1 |

FIG. 4G      402G

|  | First SCC | Second SCC | Third SCC |
|---|---|---|---|
| First SCC | (A[1,1] = )0 | (A[1,2] = )1 | (A[1,3] = )1 |
| Second SCC | (A[2,1] = )0 | (A[2,2] = )0 | (A[2,3] = )1 |
| Third SCC | (A[3,1] = )0 | (A[3,2] = )0 | (A[3,3] = )0 |

| Slew / Load | $T_1^S$ | ... | $T_N^S$ |
|---|---|---|---|
| $C_1$ | $D_{1,1}$ | ... | $D_{1,N}$ |
| ⋮ | ⋮ | ⋱ | ⋮ |
| $C_M$ | $D_{M,1}$ | ... | $D_{M,N}$ |

502B $\rightarrow \begin{bmatrix} D_{1,1} & \cdots & D_{1,N} \\ \vdots & \ddots & \vdots \\ D_{M,1} & \cdots & D_{M,N} \end{bmatrix}$

| Slew / Load | $T_1^S$ | ... | $T_N^S$ |
|---|---|---|---|
| $C_1$ | $T_{1,1}^S$ | ... | $T_{1,N}^S$ |
| ⋮ | ⋮ | ⋱ | ⋮ |
| $C_M$ | $T_{M,1}^S$ | ... | $T_{M,N}^S$ |

$$502C \rightarrow \begin{bmatrix} T_{1,1}^S & \cdots & T_{1,N}^S \\ \vdots & \ddots & \vdots \\ T_{M,1}^S & \cdots & T_{M,N}^S \end{bmatrix}$$

| Slew / Load | $T_1^S$ | ... | $T_N^S$ |
|---|---|---|---|
| $C_1$ | $f_{1,1}$ | ... | $f_{1,N}$ |
| ⋮ | ⋮ | ⋮ | ⋮ |
| $C_M$ | $f_{M,1}$ | ... | $f_{M,N}$ |

$$502D \rightarrow \begin{bmatrix} V(t)_{1,1} & \cdots & V(t)_{1,N} \\ \vdots & \ddots & \vdots \\ V(t)_{M,1} & \cdots & V(t)_{M,N} \end{bmatrix}$$

| Pin | Rise/Fall | Tolerance | | | |
|---|---|---|---|---|---|
| | | 5ps | 3ps | 1ps | 0.1ps |
| A0 | Rise | 1 | 1 | 6 | 9 |
| | Fall | 1 | 1 | 1 | 1 |
| A1 | Rise | 1 | 1 | 2 | 9 |
| | Fall | 1 | 1 | 1 | 2 |
| B0 | Rise | 1 | 1 | 3 | 6 |
| | Fall | 1 | 1 | 1 | 1 |
| B1 | Rise | 1 | 1 | 3 | 4 |
| | Fall | 1 | 1 | 1 | 1 |
| C0 | Rise | 1 | 1 | 2 | 5 |
| | Fall | 1 | 1 | 1 | 1 |
| C1 | Rise | 1 | 1 | 2 | 2 |
| | Fall | 1 | 1 | 1 | 1 |
| D0 | Rise | 1 | 1 | 1 | 5 |
| | Fall | 1 | 1 | 1 | 1 |
| D1 | Rise | 1 | 1 | 1 | 1 |
| | Fall | 1 | 1 | 1 | 1 |

FIG. 6

METHODS, SYSTEMS, AND ARTICLES OF MANUFACTURE FOR ENHANCING TIMING ANALYSES WITH REDUCED TIMING LIBRARIES FOR ELECTRONIC DESIGNS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office parent file or records, but otherwise reserves all copyright rights whatsoever.

BACKGROUND

Gauging whether an electronic circuit may operate at the specified speed needs the ability to determine or calculate, during the design stage of the electronic design, the delays of the electronic circuit at various steps. The calculated delays may then be incorporated in various stages (e.g., logic synthesis, placement, routing, post-route optimizations, etc.) of the electronic design process to ensure that the electronic design may perform as designed at the specified speed. Although timing analyses may be performed with a rigorous circuit simulation, timing analyses such as static timing analysis (STA) are a method of computing the expected timing of an electronic circuit with fast and reasonably accurate results without requiring a simulation of the electronic circuit in its entirety in order to avoid the expensive cost in runtime. Timing analyses utilize timing models that provide, for example, timing information (e.g., timing attributes, timing constraints, etc.) and/or other description (e.g., cell description, bus description, environment description, etc.) for electronic design components.

For an electronic design component (e.g., a wide complex cell, a multi-bit cell, etc.) that includes multiple inputs, the number of timing models for each input of the electronic design component may be large. This large number of timing models may then be incorporated into the timing library and used in the timing analyses for the electronic design including the electronic design component. Nonetheless, such timing analyses may require significant runtime because delay calculations may need to perform a simulation for each timing model.

Therefore, there exists a need for a method, system, and computer program product for enhancing timing analyses with reduced timing libraries for electronic designs.

SUMMARY

Disclosed are method(s), system(s), and article(s) of manufacture for enhancing timing analyses with reduced timing libraries for electronic designs in various embodiments. Some embodiments are directed at a method for enhancing timing analyses with reduced timing libraries for electronic designs. In these embodiments, dominance relations for multiple timing models for timing analyses may be determined, and a dominance adjacency data structure may be generated based at least in part upon the dominance relations.

The dominance adjacency data structure may be stored at a first location of a non-transitory computer accessible storage medium. The plurality of timing models may be reduced into a reduced set of timing models at least by providing the dominance adjacency data structure as an input to a transformation and further by transforming the dominance adjacency data structure with the transformation into the reduced set of timing models that are used in timing analyses for an electronic design or a portion thereof.

In some of these embodiments, the plurality of timing models may be identified from characterization results of the electronic design or the portion thereof having a plurality of inputs; and timing analysis results may be generated at least by performing the one or more timing analyses with the reduced set of timing models. In addition or in the alternative, a plurality of data structures may be identified from the plurality of timing models; and a first matrix may be generated based in part or in whole upon the plurality of timing models. In some embodiments, a timing model of the plurality of timing models includes an output waveform data structure including output waveform data for the electronic design or the portion thereof.

In some embodiments where the first matrix is generated based in part or in whole upon the plurality of timing models, the diagonal entries of the first matrix may be set to a first value indicative of self-dominance of the plurality of timing models; and non-diagonal entries of the first matrix may be set to the first value or a second value based in part or in whole upon the dominance relations for the plurality of timing models, the second value indicative of a first timing model not dominating a second timing model.

In some of these immediately preceding embodiments, a first output waveform may be identified from a first timing model and a second output waveform from a second timing model; and the first waveform may be aligned with the second waveform based in part or in whole upon first delay data of the first timing model and second delay data of the second timing data. In addition or in the alternative, one or more dominance criteria may be identified based in part or in whole upon a plurality of waveforms of the plurality of timing models, rather than upon slew and or delay data, for determining the dominance relations.

In some of these immediately preceding embodiments, the first timing model and the second timing model may be compared with each other based in part or in whole upon the one or more dominance criteria; and the dominance relations may be generated based in part or in whole upon results of comparing the first and second timing models. Optionally, a tolerance value may be identified; and the first timing model may be compared with the second timing model based further in part upon the tolerance value.

To reduce the plurality of timing models, a directed graph may be received (if already existing) or generated anew based in part or in whole upon the dominance adjacency data structure; and a plurality of strongly connected components may be identified from the directed graph and stored at a second location of a non-transitory computer accessible storage medium based in part or in whole upon unique indices and/or low-link indices of a plurality of vertices in the directed graph.

In some of these immediately preceding embodiments, a condensation graph may be generated and stored at a third location of a non-transitory computer accessible storage medium at least by transforming the directed graph into the condensation graph using at least the plurality of strongly connected components. In addition or in the alternative, one or more vertices having zero input valency or zero input degree may be identified in the condensation graph; and the reduced set of timing models may then be generated based in part or in whole upon the one or more vertices having the zero input valency or zero input degree.

Some embodiments are directed at one or more hardware modules and modules that include and/or function in conjunction with at least one micro-processor as well as other related components or architectures of one or more computing systems and may be invoked to perform any of the methods, processes, or sub-processes disclosed herein.

Each of these modules may include or function in tandem with electrical circuitry and one or more micro-processors each having one or more processor cores to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. A module is initialized in a computing system so that the software portion of the module is stored in memory (e.g., random access memory) to be executed by one or more processors or processor cores off the computing system to perform at least a part of the functionality of the module. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for enhancing timing analyses with reduced timing libraries for electronic designs are described below with reference to FIGS. 1-7.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 3A-B jointly illustrate a more detailed block diagram for enhancing timing analyses with reduced timing libraries for electronic designs in one or more embodiments.

FIG. 4G illustrates an example of a data structure that may be used in determining dominance relations in one or more embodiments.

FIG. 4H illustrates an example of an adjacency data structure that may be used in determining dominance relations in one or more embodiments.

FIG. 5B illustrates an example of a part of a timing model and the corresponding matrix representation in one or more embodiments.

FIG. 5C illustrates another example of a part of a timing model and the corresponding matrix representation in one or more embodiments.

FIG. 5D illustrates another example of a part of a timing model and the corresponding matrix representation in one or more embodiments.

FIG. 6 illustrates some examples of reducing timing models with respect to different tolerances in one or more embodiments.

DETAILED DESCRIPTION

Various embodiments are directed to a method, system, and computer program product for enhancing timing analyses with reduced timing libraries for electronic designs. Other objects, features, and advantages of the invention are described in the detailed description, figures, and claims.

A directed graph may then be constructed using the plurality of timing models as a plurality of vertices and the dominance relations as the edges. A plurality of strongly connected graphs may be identified from the directed graph by providing the dominance adjacency data structure as an input to a transformation. A condensation graph may then be generated by transforming the directed graph based in part or in whole upon the plurality of strongly connected components. The total number of the plurality of timing models may thus be reduced to produce a reduced set of timing models based in part or in whole upon one or more zero input degree or zero input valency vertices in the condensation graph.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-7.

Figure 1:
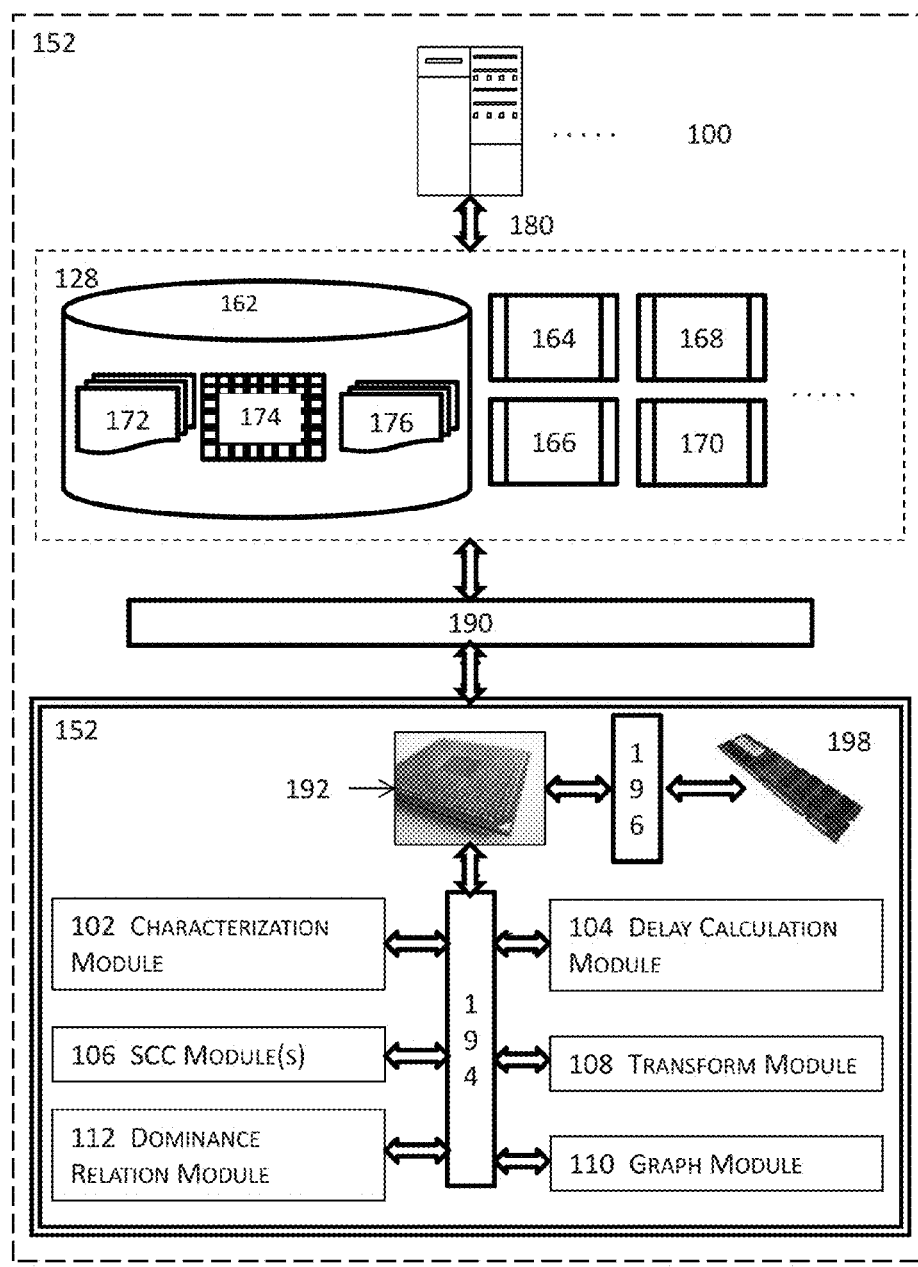
FIG. 1 illustrates a high level schematic system diagram for enhancing timing analyses with reduced timing libraries for electronic designs in one or more embodiments.

FIG. 1 illustrates a high level schematic system diagram for enhancing timing analyses with reduced timing libraries for electronic designs in one or more embodiments. More specifically, FIG. 1 illustrates an illustrative high level schematic block diagrams for enhancing timing analyses with reduced timing libraries for electronic designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of mechanisms or modules (hereinafter module or modules) 152 including hardware and/or software modules or combinations of one or more hardware and one or more software modules. To the extent that a module includes at least in part a software program, at least the software program is stored at a location in a non-transitory computer accessible storage medium (e.g., random access memory or RAM). Each of these modules may include or function in tandem with electrical circuitry and one or more micro-processors each having one or more processor cores to perform its intended functions.

The hardware system may further include one or more forms of non-transitory machine-readable storage media or persistent storage devices (e.g., hard disk drive(s), disk array(s), etc.) to temporarily or persistently store various types of data or information, various design rules, various libraries (e.g., timing libraries in the timing library format or TLF), selected and selectable targets, or any other suitable information or data, etc. A module may be initialized in a computing system so that the software portion of the module is stored in memory (e.g., random access memory or RAM) to be executed by one or more processors or processor cores of the computing system to perform at least a part of the functionality of the module or module. Some illustrative modules, modules, or components of the hardware system may be found in the System Architecture Overview section below.

The set of modules 152 may comprises a characterization module 102 that is to, for example, characterize one or more electronic design components with respect to multiple inputs and multiple, different loads to determine (e.g., construct) corresponding one or more timing models for each input of the electronic design component. The set of modules 152 may also include a delay calculation module 104 that is to, for example, calculate delays for an electronic design or a portion thereof.

The set of modules 152 may further optionally include one or more strongly connected component modules 106 that are to, for example, determine strong connected components from a graph for an electronic design or a portion thereof under consideration. In addition or in the alternative, the set of modules 152 may include a transform module 108 that is to, for example, transform one graph into another graph, one data structure into another data structure, or generally one object into another object.

The set of modules 152 may include a graph module 110 that functions in tandem with, for example, the SCC module 106, the transform module 108, and/or the dominance relation module 112 to, for example, manipulate (e.g., construct, modify, convert, transform, etc.) one or more graphs (e.g., a graph of dominance corresponding to an adjacency matrix, a condensation graph, a directed graph, a directed acyclic graph or a DAG, a graph for strongly connected components, etc.) for an electronic design or a portion thereof. The set of modules 152 may also include a dominance relation module 112 that is to, for example, determine whether one timing model or a table dominates another timing model or table.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
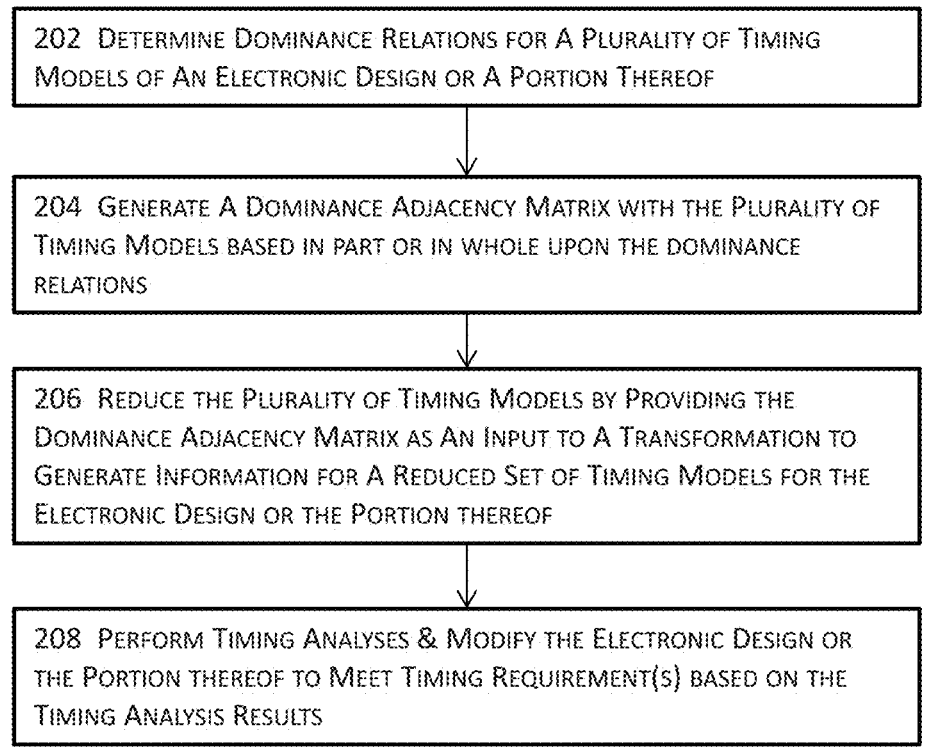
FIG. 2 illustrates a high block diagram for enhancing timing analyses with reduced timing libraries for electronic designs in one or more embodiments.

FIG. 2 illustrates a high block diagram for enhancing timing analyses with reduced timing libraries for electronic designs in one or more embodiments. The techniques described herein generate a dominance adjacency data structure with a plurality of timing models for an electronic design or a portion thereof and reduce the plurality of timing models to a reduced set of timing models by processing the dominance adjacency data structure with one or more transformations. The reduced set of timing models may then be incorporated into or integrated with timing libraries and may further be used in timing analyses of the electronic design or the portion thereof. More specifically, dominance relations may be determined at 202 for a plurality of timing models of an electronic design or a portion thereof (e.g., a cell having a plurality of inputs).

A timing model may include or be associated with or linked to one or more data structures (e.g., one or more tables, one or more matrix representations, etc.) including information related to or required by timing analyses in some embodiments. A timing model of an electronic design or a portion thereof may be established by characterizing the electronic design or the portion thereof with one or more simulations performed on the electronic design or the portion with a load of a plurality of loads and an input slew of a plurality of input slews in some embodiments.

Figure 5A:
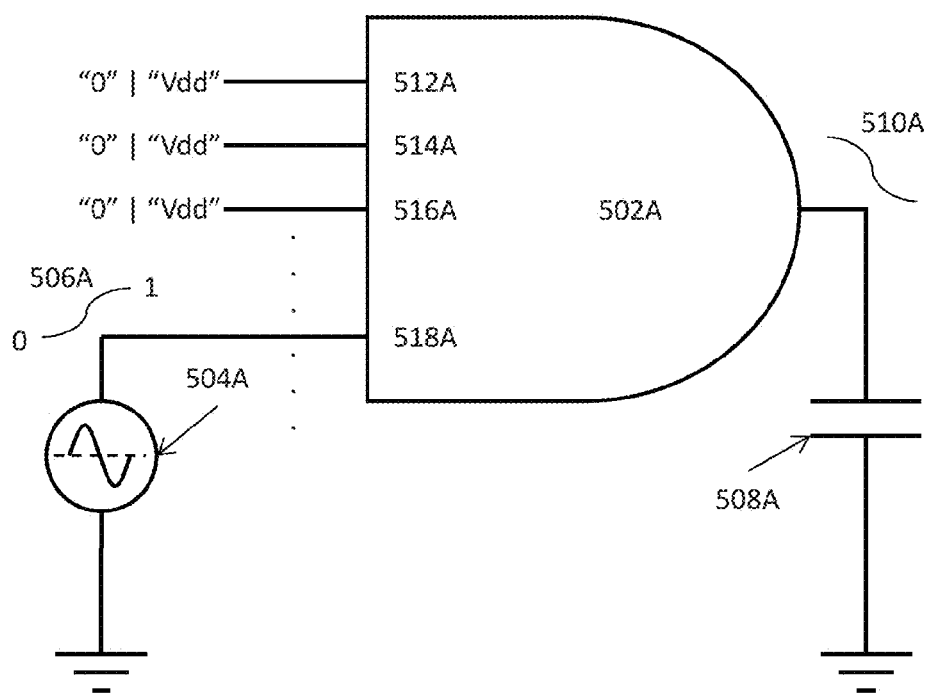
FIG. 5A illustrates a simplified schematic diagram of an electronic design component to which various techniques for enhancing timing analyses with reduced timing libraries for electronic designs may be applied in one or more embodiments.

In the example of a cell illustrated in FIG. 5A, the cell receives a plurality of inputs (512A, 514A, 516A, . . . , 518A) and outputs a simplified lump capacitive load 508A. In an example of cell simulation, all the plurality of inputs except the active input (e.g., 518A) receives constant voltage sources (e.g., "0" or "Vdd" as illustrated in FIG. 5A) coupled with these inputs. The active, switching input (e.g., 518A) is coupled with a voltage source that represents a transition signal 504A whose waveform may be predetermined and may further be parameterized with a slew rate. The cell in this example may be simulated with a plurality of input slews (e.g., a total of N input slews) and a plurality of lumped capacitive loads (e.g., a total of M loads for 508A).

For the transition signal 504A attached to an active, switching input (while the remaining inputs have constant voltage values of "0" or "Vdd"), M simulations may be performed—one simulation for each of the total of M loads. A similar transitioning input signal may have N different input stews while holding the remaining inputs at constant voltages (e.g., "0" or "Vdd"). Each input may be characterized for the rising input transition as well as the falling input transition. Therefore, characterizing the cell in this example in FIG. 5A performs a total of 2×M×N simulations to produce a timing model for this cell with multiple inputs as illustrated in FIG. 5A. In some embodiments, a timing model so determined includes one or more data structures of an output slew data structure, an output waveform data structure, or an output delay data structure as illustrated in FIGS. 5B-D and described below. In some embodiments, the stimuli to the cell may be altered to re-characterize the cell to produce another timing model. In some of these embodiments, the stimuli may be altered multiple times for the characterization of the cell to produce a plurality of timing models.

In some of these embodiments, a tuning model may include or be associated with or linked to a delay data structure, a wave form data structure, and or a slew data structure. FIGS. 5B-D illustrate some examples of these data structures some of which may be included in a timing model. For example, FIG. 5B illustrates an example of an output delay data structure (e.g., the table 500B in FIG. 5B) that may be included in or associated with a timing model. In some of these embodiments, a matrix representation 502B corresponding to the output delay data structure may also be included or associated with the timing model. In the example illustrated in FIG. 5B, $C_i$ represents the i-th load of a plurality of loads $(C_1, C_2, \ldots, C_M)$; $T_j^S$ denotes the j-th input slew of a plurality of input slews $(T_1^S, T_2^S, \ldots, T_N^S)$; and $D_{i,j}$ denotes the output delay corresponding to the i-th load and j-th input slew.

FIG. 5C illustrates an example of an output slew data structure (e.g., table 500C in FIG. 5C) that may be included in or associated with a timing model. In some of these embodiments, a matrix representation 502C corresponding to the output slew data structure may also be included or associated with the timing model. In the example illustrated in FIG. 5C, $C_i$ represents the i-th load of a plurality of loads $(C_1, C_2, \ldots, C_M)$ $T_j^S$ denotes the j-th input slew of a plurality of input slews $(T_1^S, T_2^S, \ldots, T_N^S)$; and $T_{i,j}^S$ denotes the output slew corresponding to the i-th load and the j-th input slew.

FIG. 5D illustrates an example of an output waveform data structure (e.g., table 500D in FIG. 5D) that may be included in or associated with a timing model. In some of these embodiments, a matrix representation 502D corresponding to the output slew data structure may also be included or associated with the timing model. In the example illustrated in FIG. 5D, $C_i$ represents the i-th load of a plurality of loads $(C_1, C_2, \ldots, C_M)$; $T_j^S$ denotes the j-th input slew of a plurality of input slews $(T_1^S, T_2^S, \ldots, T_N^S)$; and $f_{i,j}$ denotes the voltage response at the output of the cell that has been characterized to specific switching j-th input slew with stable conditions (e.g., constant voltages of "0" or "Vdd") on the remaining inputs, and a specific i-th load. In the corresponding matrix representation 502D, $V(t)_{i,j}$ denotes the time-dependent voltage function corresponding to the i-th load and the j-th input slew.

A dominance relation between two timing models, $TM_1$ and $TM_2$, may be determined based in whole or in part upon one or more dominance criteria. Dominance relations between two timing models, $TM_1$ and $TM_2$, may include, for example, the first scenario where neither $TM_1$ nor $TM_2$ dominates each other. Dominance relations may also include the second scenario where one timing model (e.g., $TM_1$) dominates the other timing model (e.g., $TM_2$). If the first timing model $TM_1$ dominates the second timing model $TM_2$, the dominance relation between these two timing models may be expressed as, for example, $TM_1 \Leftarrow TM_2$ or any other suitable expressions.

Dominance relations may also include the third relation where one timing model (e.g., $TM_1$) is dominated by the other timing model (e.g., $TM_2$). If the first timing model $TM_1$ is dominated by the second timing model $TM_2$, the dominance relation between these two timing models may be expressed as, for example, $TM_1 \Leftarrow TM_2$ or any other suitable expressions. In some embodiments, the dominance relation between these two timing models may include the fourth scenario where these two timing models dominate each other. If the first timing model $TM_1$ and the second timing model $TM_2$ dominate each other, the dominance relation between these two timing models may be expressed as, for example, $TM_1 \Longleftrightarrow TM_2$ or any other suitable expression.

As described above, a dominance relation may be determined at 202 based in part or in whole upon one or more criteria in some embodiments. The one or more dominance criteria may include, for example, whether a first waveform representation or data therefor in a first timing model lies entirely or partially to the right of a second waveform representation or data therefor in a second timing model after aligning the first and second waveforms (or the respective data therefor) with their respective delays in some embodiments.

In the event that the first waveform lies entirely to the right of the second waveform after these two waveforms are properly aligned with corresponding delays, the first waveform comes later than and hence dominates the second waveform. In the examples illustrated in FIG. 5E, the second waveform 504E lies entirely to the left of the first waveform 502E. In this example, the first timing model corresponding to the first waveform 502E is considered dominating the second timing model corresponding to the second waveform 504E. In some of these embodiments, the one or more criteria may be based on the waveforms of timing models, rather than slew and delay data.

One of the advantages of determining dominance relations based on one or more criteria founded upon the waveforms instead of slew and delay data is that the consideration of both slew and delay in determining whether a timing model dominates another timing model may skew the determination and thus mischaracterize the dominance relation. In the example illustrated in FIG. 5E, the delay of waveform 502E is smaller than the delay of waveform 504E, but the slew of waveform 502E is greater than the slew of waveform 504E. In this example, considering both the delay and slew data in determining the dominance relation between these two timing models may lead to inclusive or even incorrect result due to the conflicting slew and delay data. A waveform-based determination criterion as described above may avoid such inconclusive or incorrect determination results.

In some embodiments where a first waveform intersects the second waveform such that a part of the first waveform lies to the left of a portion of the second waveform while another part the first waveform lies to the right of another portion of the second waveform. In these embodiments, a tolerance value (e.g., 0.1-ps, 0.5-ps, 1-ps, 5-ps, etc.) may be identified (if already existing) or determined anew and may be used to determine the dominance relation between two waveforms.

Figure 5E:
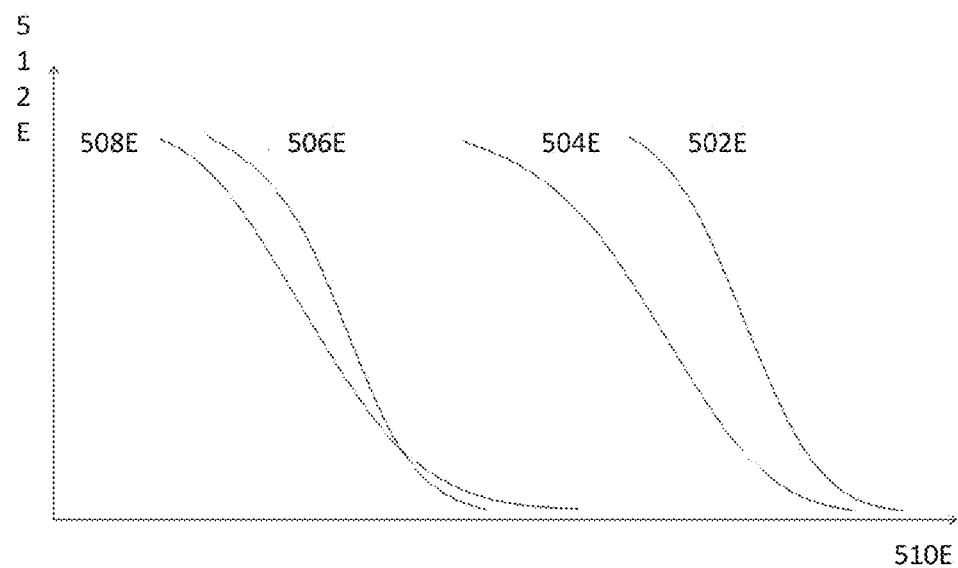
FIG. 5E illustrates an example to aid the explanations for dominance relations for four waveforms examples in one or more embodiments.

In the example illustrated in FIG. 5E, the two waveforms 506E and 508E of two timing models may be compared with each other based on a tolerance to determine the dominance relation between these two waveforms 506E and 508E. More specifically, the upper portion of the waveform 506E above the intersection is to the right of the corresponding upper portion of waveform 508E, whereas the lower portion of waveform 506E below the intersection lies to the left of the lower portion of waveform 508E.

In some embodiments where a tolerance is identified or determined so that the differences between the time values of the two waveforms corresponding to the same voltage value fall within the tolerance, these two waveforms 506E and 508E may be considered as dominating each other. In some embodiments where a tolerance is identified or determined so that certain percentage of differences between the time values of the two waveforms corresponding to the same voltage value fall outside the tolerance, it may be determined that neither waveform 506E nor waveform 508E dominates each other. In these embodiments, it may be determined that neither waveform 506E nor waveform 508E dominates the other waveform due to the intersection between these two waveforms and further due to the tolerance value. For example, the upper portion of 506E lies to the right of the upper portion of 508E in FIG. 5E, while the lower portion of 506E lies to the left of the lower portion of 508E. If the differences between the upper portion of 506E and the upper portion of 508E are greater than a prescribed tolerance, and the differences between the lower portion of 506E and the lower portion of 508E are also greater than the prescribed tolerance, neither waveforms 506E nor waveform 508E dominates each other.

Referring back to FIG. 2, a dominance adjacency matrix may be generated (if not yet existing) or identified (if already existing) at 204 with the plurality of timing models based in whole or in part upon dominance relations determined at 202. An example of a dominance adjacency matrix for six timing models ($TM_1$, $TM_2$, $TM_3$, $TM_4$, $TM_5$, $TM_6$) is illustrated in FIG. 4G where a value Dominance[i, j] of "1" indicates that the timing model $TM_i$ dominates the timing model $TM_j$.

In some embodiments, the diagonal entries (indicated by 402G) in a dominance adjacency matrix may be initialized to the value of "1" or another suitable value because a timing model always dominates itself. In addition, all the other entries in the dominance adjacency matrix may be initialized to the value "0" or any other suitable value. These entries may then be determined by examining the waveforms of each pair of waveforms of two timing models. It shall be noted that the dominance adjacency matrix is not a symmetric matrix because the fact that TMi dominates TMj does not necessarily imply that TMj always dominates TMi.

For example, the dominance relations between TMi and TMj may include one or more relations of TMi dominating TMj, TMj dominating TMi, TMi and TMj dominate each other, or neither TMi nor TMj dominates each other. As a result of this non-symmetry of a dominance adjacency matrix, each pair of timing models results in two determinations—whether a first timing model TMi dominates a second timing model TMj, and whether the second timing model TMj dominates the first timing model TMi. The corresponding entries in the dominance adjacency matrix may then be populated with the determination results. More details about determining the dominance relations will be described in subsequent paragraphs with reference to FIGS. 3A-B.

The plurality of timing models obtained from characterizations of an electronic design or a portion thereof with respect to a set of loads and a plurality of input slews may then be reduced at 206 by providing the dominance adjacency matrix as an input to a transformation that generates information for a reduced set of timing models for the electronic design or the portion thereof. In some embodiments, the transformation includes a transformation that determines strongly connected components of a directed graph for the plurality of timing models and the dominance relations.

The directed graph may include the plurality of timing models as vertices and the dominance relations as represented in the dominance adjacency matrix as edges among the vertices. Any transformations such as Tarjan's strongly connected components algorithm, the path-based strong component algorithm, etc. may be used to transform a directed graph into the directed graph's strongly connected components where each vertex in the directed graph appears in exactly one strongly connected component. More details about some examples of the transformation will be described in subsequent paragraphs with reference to FIGS. 3A-C and 4A-F.

With the reduced set of timing models, one or more timing analyses may be performed at 208 to produce timing analysis results. For example, the timing models in the reduced set of timing models, rather than the original plurality of timing models, for the cells or blocks in the electronic design or the portion thereof may be used in delay calculations to provide, for example, the behavior of these cells or blocks for the simulations of the electronic design or the portion thereof. In some embodiments, a timing model including an output delay data structure, an output waveform data structure, and/or an output slew data structure may be used in either a circuit simulation (e.g., a SPICE simulation), analyses with a DCL (delay calculation language) program, or any other delay or timing analysis techniques to determine, for example, delays of entire paths, the delay of a single logic gate and wire(s) attached to the single logic gate, the delays of individual wires, delays of individual cells or blocks, statistical delay calculation or timing analyses, etc. for an electronic design or a portion thereof. Various pieces of information including, for example, delay information, timing propagation, critical path reporting, etc. may be generated as a result of the one or more timing analyses performed at 208.

Figure 3B:
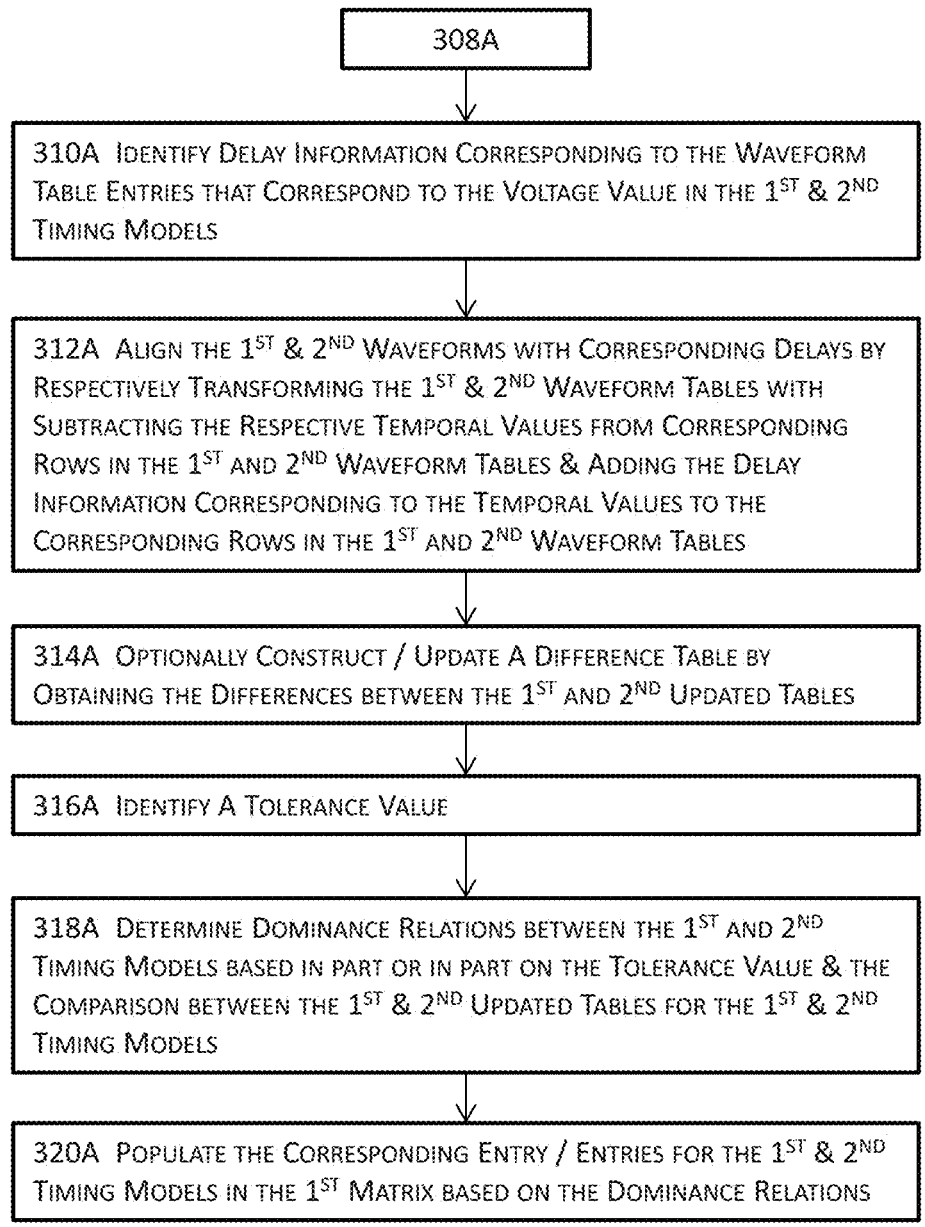

FIGS. 3A-B jointly illustrate a more detailed block diagram for enhancing timing analyses with reduced timing libraries for electronic designs in one or more embodiments. More specifically, FIGS. 3A-B illustrate more details about generating a dominance adjacency matrix. In these one or more embodiments illustrated in FIGS. 3A-B, a plurality of data structures may be identified at 302A from a plurality of timing models. These plurality of timing models may include those obtained from characterizing an electronic design or a portion thereof with a plurality of input waveforms (e.g., transition signals) and/or state values (e.g., constant signal values of "0" or "Vdd") and a plurality of loads as described above with reference to FIG. 2.

In some embodiments, the plurality of data structures identified for a timing model may include, for example, an output slew data structure, an output delay data structure, and/or an output waveform model. A first matrix may be generated at 304A according to the plurality of timing models. For example, if there is a total of K timing models $TM_i$ (i=1, 2, . . . , K, where K=an integer), a K×K matrix "B" may be generated at 304A where each entry B[i, j] denotes a dominance relation that identifies whether the first timing model $TM_i$ dominates the second timing model $TM_j$.

The first matrix includes values indicative of the dominance relations among the plurality of timing models. The diagonal entries of the first matrix may be optionally set at 306A to, for example, a first value (e.g., "1") indicative of a timing model dominates itself.

At 308A, waveform table entry values (e.g., temporal values) corresponding to a predetermined output voltage value may be identified for each row in the waveform data structures of the plurality of timing models. In some embodiments, the predetermined output voltage value may include 0.5 Vdd, and a corresponding temporal value identified at 308A may be denoted as $t_{0.5V}$. At 310A, delay data or information corresponding to the waveform table entry values that are identified at 308A and correspond to the predetermined output voltage value may be identified. At 312A, the first and second waveforms may be aligned with their corresponding delay information or data identified at 312A. For any pair of first and second waveforms (e.g., the output waveforms from the corresponding timing models) respectively corresponding to the first and second timing models may be aligned at 312A by using, for example, the corresponding delay information or data (e.g., delay information or data from the output delay data structures for the pair of timing models of interest) in some embodiments. Aligning the output waveforms using the corresponding delay information correctly correlate the output waveforms on the temporal axis so that the aligned output waveforms correctly illustrate the temporal relations. In some embodiments, aligning a waveform with its delay may be accomplished by subtracting the corresponding temporal values ($t_{0.5V}$) from each of the rows of the waveform data structure of a timing model and then by adding delay data structure entries ($D_{i,j}$) corresponding to the temporal values in the delay data structure to the corresponding rows of the waveform data structure.

For example, the temporal values ($t_{0.5V}$) corresponding to 0.5 Vdd may be identified from the waveform data structures of the timing models; and the delay entries (e.g., $D_{i,j}$) corresponding to these temporal values ($t_{0.5V}$) may also be identified from the output delay data structures of the plurality of timing models for these temporal values ($t_{0.5V}$). When aligning the first and second waveforms with their respective delays, the first and the second waveform data structures of the first and second timing models may be respectively transformed by subtracting the respective temporal values from the corresponding rows in the first and second waveform data structures and further by adding the respective delay entries to the corresponding rows in some embodiments.

In some embodiments, the first waveform data structure is transformed into a first updated data structure; and the second waveform data structure is transformed into a second updated data structure. In some of these embodiments, a difference data structure may be optionally constructed at 314A by obtaining the differences between the corresponding entries in the first and the second updated data structures. In some embodiments, a tolerance value may be identified at 316A. A tolerance value may include, for example, a temporal value (e.g., 0.1 picoseconds or 0.1 ps, 0.5 ps, 1 ps, 5 ps, 10 ps, etc.) This tolerance may be used to determine the dominance relation between two waveforms.

For example, the difference data structure optionally constructed at 314A includes the differences between the corresponding entries in two waveform data structures. The differences may be compared to the tolerance identified at 316A to determine the dominance relation between these two waveforms and hence between these two corresponding timing models. At 318A, dominance relations may be determined at 318A between the first and the second timing models based in part or in whole upon the tolerance value identified at 316A and the comparison results between the first and second updated data structures for the first and second timing models.

Two timing models may be compared based in part or in whole upon one or more dominance criteria. The one or more criteria may be based on the waveforms in or associated with timing models, rather than slew and delay data in some embodiments. One of the advantages of determining dominance relations among timing models based on one or more criteria founded upon the waveforms instead of slew and delay data is that the consideration of both slew and delay in determining whether a timing model dominates another timing model may skew the determination and thus mischaracterize the dominance relation, whereas the one or more criteria based on the waveforms provide more complete and/or accurate results. In some embodiments where a difference data structure (e.g., a difference matrix) is constructed at 314A, dominance relations may be determined at 318A between the first and the second timing models based in part or in whole upon the tolerance value identified at 316A and the corresponding values in the difference data structure.

With the dominance relations determined at 318A, the corresponding entry (e.g., the first timing model dominates the second timing model or $TM_1 \Rightarrow TM_2$) or entries (e.g., the first timing model dominates the second timing models or $TM_1 \Rightarrow TM_2$, the second timing model dominates the first timing model or $TM_2 \Rightarrow TM_1$) for the first and second timing models may be populated at 320A based in part or whole upon the dominance relations determined at 318A. For example, if i-th timing model $TM_i$ dominates the j-th timing model $TM_j$, the corresponding entry B[i, j] may be populated with a first value (e.g., "1"). On the other hand, if i-th timing model $TM_i$ does not dominate the j-th timing model $TM_j$, the corresponding entry B[i, j] may be populated with a second value (e.g., "0"). As described above, the dominance adjacency matrix is not a symmetric matrix because the fact that $TM_i$ dominates $TM_j$ does not necessarily imply that $TM_j$ does or does not dominate $TM_i$. For example, the dominance relations between $TM_i$ and $TM_j$ may include one or more relations of $TM_i$ dominating $TM_j$, $TM_j$ dominates $TM_i$, $TM_i$ and $TM_j$ dominate each other, and/or neither $TM_i$ nor $TM_j$ dominates the other. As a result of this non-symmetry of a dominance adjacency matrix, each pair of timing models results in two determinations—whether the i-th timing model $TM_i$ dominates the j-th timing model $TM_j$, and whether the j-th timing model $TM_j$ dominates the i-th timing model $TM_i$.

Figure 3C:
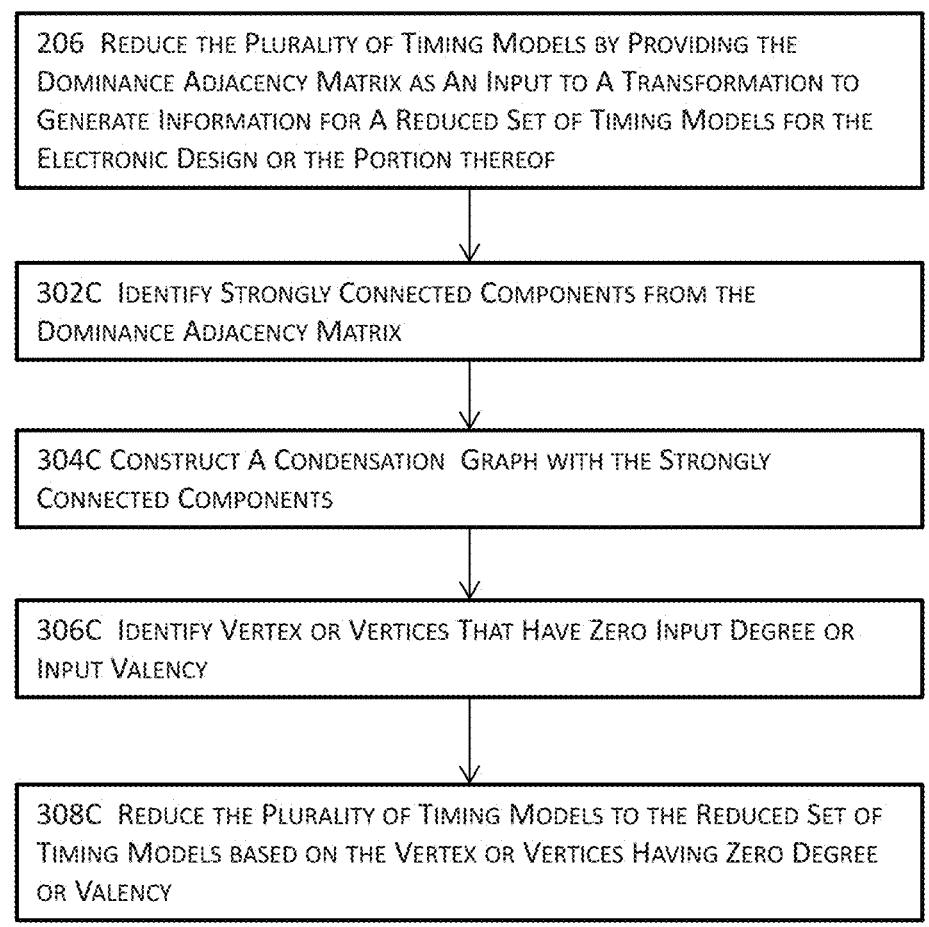
FIG. 3C illustrates a more detailed block diagram for enhancing timing analyses with reduced timing libraries for electronic designs in one or more embodiments.

FIG. 3C illustrates a more detailed block diagram for enhancing timing analyses with reduced timing libraries for electronic designs in one or more embodiments. More specifically, FIG. 3C illustrates more a detailed flow diagram for the act of reducing a plurality of timing models. In these one or more embodiments illustrated in FIG. 3C, strongly connected components may be identified at 302C by providing a dominance adjacency matrix as an input to a transformation. In some embodiments, a transformation includes a transformation that determines strongly connected components of a directed graph for the plurality of timing models and the dominance relations.

The directed graph may include the plurality of timing models as vertices and the dominance relations as represented in the dominance adjacency matrix as edges among the vertices. Any transformations such as Tarjan's strongly connected components algorithm, the path-based strong component algorithm, etc. may be used to transform a directed graph into the directed graph's strongly connected components where each vertex in the directed graph appears in exactly one strongly connected component. A strongly connected component of a directed graph (e.g., a directed graph including the plurality of timing models as vertices and the dominance relations as edges among the vertices) includes a subgraph that is strongly connected (e.g., the subgraph includes a path in each direction between each pair of vertices of the subgraph).

The identified strongly connected components lay be detached and used to construct a condensation graph at 3040. The condensation graph may be constructed by contracting each strongly connected component identified at 3020 to a single vertex in some embodiments. For example, with the strongly connected components identified at 3020 from, for example, a dominance adjacency data structure, a directed graph may be constructed with these identified strongly connected components. An example of generating such a directed graph is illustrated in FIGS. 4A-F.

A condensation graph may be constructed for a directed graph by contracting each strongly connected component into a single vertex and generate the condensation graph with the single vertices. The condensation graph thus obtained has no strongly connected subgraphs with more than one vertex and is thus acyclic in nature. The graph FIG. 4F may be used to form a condensation graph by contracting the strongly connected component 460 into a single vertex in the condensation graph. One or more vertices that have zero input degree or input valency may be identified at 3060 in the condensation graph.

The degree or valency (or an input degree or input valency) of a vertex in a graph includes the number of edges incident to the vertex where loops are counted twice. In the example illustrated in FIG. 4F, the strongly connected component {402, 404, 406, 408} has zero incident edge and may thus be identified at 3060, whereas the other two strongly connected components 480 and 470 respectively have one and two, and hence non-zero, incident edges. The plurality of timing models may thus be reduced at 308C to a reduced set of timing models having fewer timing models based in part or in whole upon the identified one or more vertices having zero input valency. With the condensation graph, the directed graph constructed with the information from the dominance adjacency data structure may be simplified, and the total number of timing models required to provide identical coverage may be reduced as shown in the condensation graph generated from the strongly connected components.

Figure 4A:
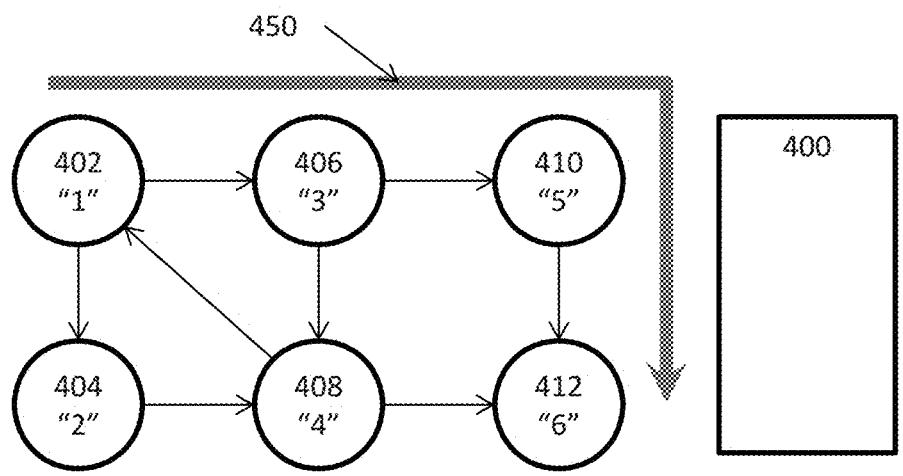
FIGS. 4A-F illustrate an example of enhancing timing analyses with reduced timing libraries for electronic designs in one or more embodiments.

FIGS. 4A-F illustrate an example of enhancing timing analyses with reduced timing libraries for electronic designs in one or more embodiments. More specifically, FIGS. 4A-F illustrate an example of determining or identifying strongly connected components using the Tarjan's algorithm. FIG. 4A illustrates a directed graph where each vertex (e.g., 402, 404, 406, 408, 410, and 412) represents a waveform data structure of a timing model, and each edge connecting two vertices represents a dominance relation. For example, the edge between vertices 402 and 406 indicates that the timing model for 402 dominates the timing model for 406.

The numbers (e.g., "1" through "6") denote the indices of the vertices. For example, 402 refers to vertex 1, 404 refers to vertex 2, etc. A depth first search may be performed along the first path 450 starting from, for example, vertex 1 (402) through vertex 3 (406), vertex 5 (410), and vertex 6 (412). Initially, the stack 400 may be empty. During the depth first search, each vertex may be associated with or assigned to a low-link index and a unique index (e.g., a timing stamp). The unique indices uniquely identifies the vertices in the order in which they are discovered. For example, vertex 1 (402) may be associated with or assigned to a first unique index of "1"; vertex 3 (406) may be associated with or assigned to a second unique index of "2"; vertex 5 (410) may be associated with or assigned to a third unique index of "3"; and vertex 6 (412) may be associated with or assigned to a fourth unique index of "4".

Figure 4B:
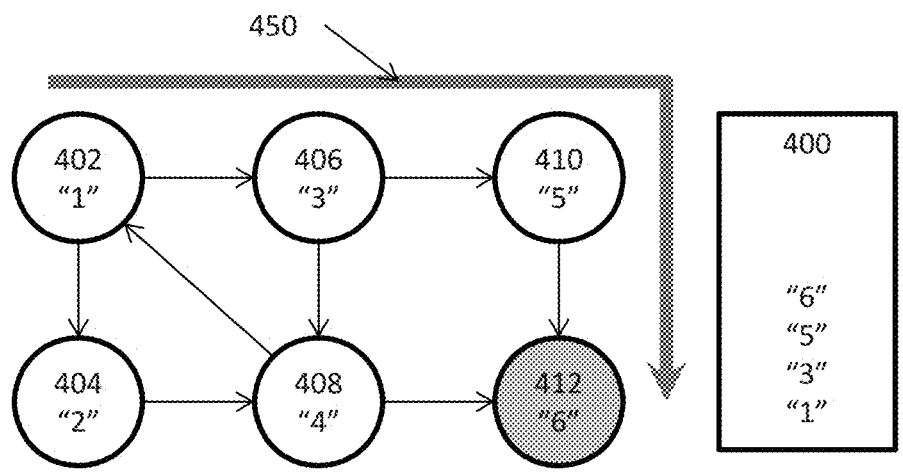
Figure 4C:
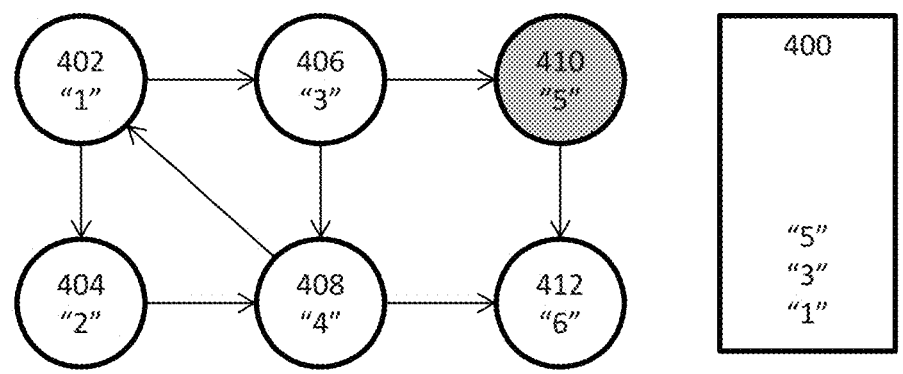

A low-link index of a first vertex includes the smallest index of a vertex, including the first vertex, reachable from the first vertex. For example, the low-link index for vertex 1 (402) is "1" because the vertex having the smallest vertex index reachable by vertex 1 is vertex 1 (402) itself. Similarly, the low-link index for vertex 3 (406) is 1 because vertex 1 (402) is the vertex having the smallest index reachable by vertex 3 (406). The low-link indices for vertex 5 (410) and vertex 6 (412) are thus 3 and 4, respectively. The vertex index of each discovered vertex during the depth first search may be stored in the stack 400. For example, at the end of this depth first search along path 450, the stack may include the values "1", "3", "5", "6" according to the order that these vertices are visited in this depth first search along the path 450 as illustrated in FIG. 4B.

For the depth first search along the path 450, a determination may be made to decide whether the unique index of a vertex discovered along the path 450 equals to its low-link index. If the determination is affirmative (e.g., the unique index equals to the low-link index), the vertex as well as the other vertex or vertices, if any, in the stack above this vertex may be designated as a strongly connected component, and the vertex index as well as the index or indices of the other vertex or vertices, if any, may be popped from stack 400. For example, the low-link index is "4" (vertex 4 or 408 having smallest vertex index reachable by vertex 6), and the unique index is also "4" (fourth vertex discovered) for vertex 6 (412). Vertex 6 as well as the other vertex or vertices, if any, in the stack above this vertex may thus be designated or identified as a strongly connected component, and its vertex number ("6") as well as the vertex number or vertex numbers for the other vertex or vertices, if any, may thus be popped from the stack 400. The stack 450 thus includes values "1", "3", and "5" as illustrated in FIG. 4O.

Figure 4D:
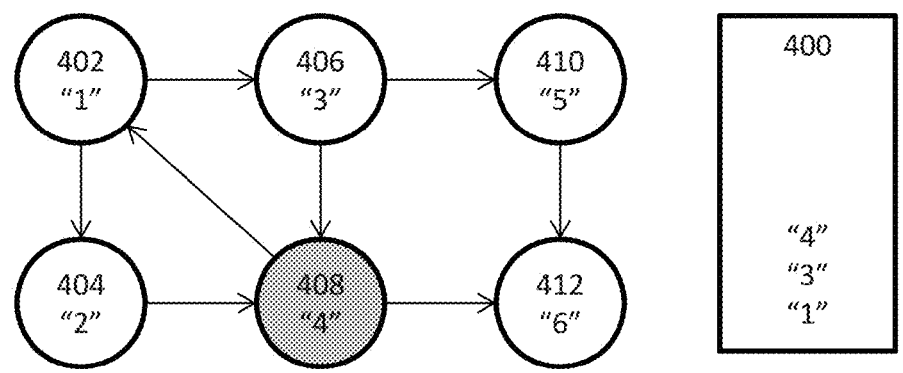

Back-tracking the path 450 arrives at vertex 5 (410) whose low-link index and unique index are both "3". Therefore, vertex 5 (410) may also be identified as a strongly connected component, and its vertex index "5" may be popped from the stack 400. The stack 450 now includes the values "1" and "3". Backtracking along the path 450 reaches vertex 3 (406) that bifurcates into another path leading to the identification or discovery of vertex 4 (408). The vertex index ("4") of vertex 4 (408) may be added to the stack 450 which now includes the values of "1", "3", and "4" as illustrated in FIG. 4D. Vertex 3 (406) is not identified or designated as a strongly connected component because its unique index ("2") is not equal to its low-link index ("1").

Figure 4E:
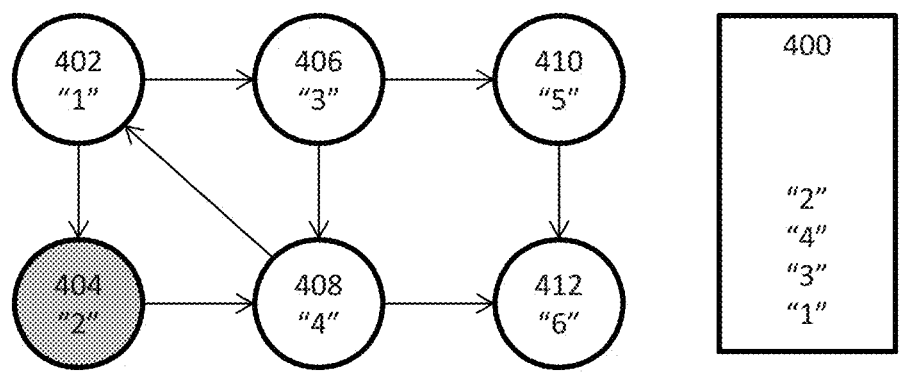

In addition, because there exists an edge point from vertex 4 (408) to vertex 1 (402) that still remains in the stack 450, the low-link index of vertex 4 (408) may be associated with or assigned to a low-link index of "1" because vertex 1 (402) has the smallest vertex index ("1") reachable by vertex 4 (408). Vertex 4 (408) may further be associated with or assigned to a unique index of "5" because vertex 4 (408) is the fifth vertex discovered or identified in the directed graph. Vertex 2 (404) may be next visited along another path between vertex 1 (402) and vertex 2 (404). The vertex index "2" of vertex 2 (404) may then be added to the stack 400 as illustrated in FIG. 4E.

The low-link index for vertex 2 (404) is "1"; and the unique index for vertex 2 (404) is "6" because vertex 2 (404) is the sixth vertex identified or discovered. The low-index and the unique index for vertex 1 (402) are both "1" because vertex 1 (402) is discovered first. As a result, vertex 1 (402) as well as the other vertex or vertices, if any, in the stack above this vertex 1 (402) may be similarly designated as a strongly connected component. Once the indices of vertex 1 (402) as well as the other vertex or vertices above vertex 1 (402) in the stack are popped from the stack, the stack is then empty. This completes the identification or discovery of all the vertices in the directed graph and produces the last strongly connected component including vertices "1", "3", "4", and "2" which may be optionally denoted as {1, 3, 4, 2} or any other suitable representations. In this example, the strongly connected components for the connected graph illustrated in FIG. 4A thus include {{1, 3, 4, 2}, 5, 6}.

Figure 4F:
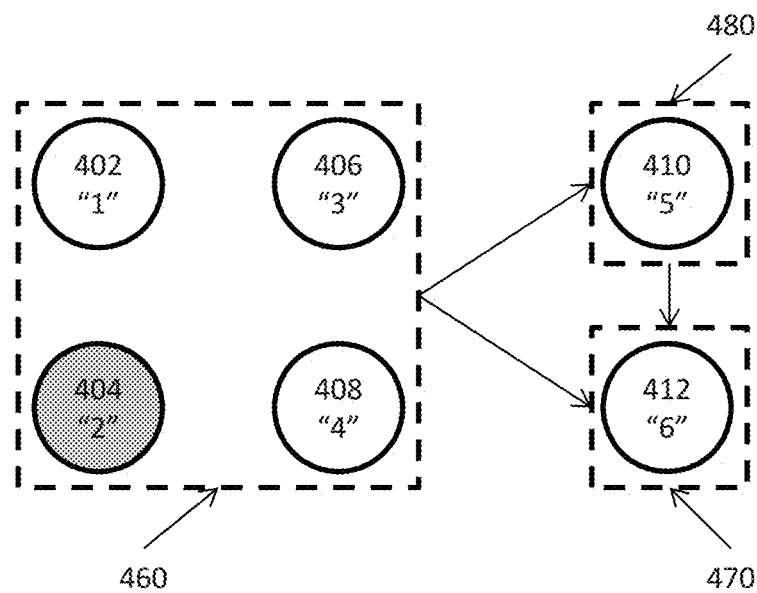

The directed graph may then be represented as shown in FIG. 4F. It shall be noted that where each square box (e.g., 460, 470, Or 480) with dashed boundaries denotes a single vertex, FIG. 4F may also represent a condensation graph that is generated with the identified strongly connected components. With a condensation graph, all vertices (strongly connected components as vertices in the condensation graph) having zero input valency or input degree may be identified. In some embodiments where FIG. 4F illustrates a condensation graph, the strongly connected component 460 may be identified as having zero input valency or zero input degree. As FIG. 4F illustrates, strongly connected component 460 dominates both strongly connected components 480 and 470. Therefore, the timing models associated with strongly connected components 470 and 480 may not be included in a reduced set of timing models for timing analyses of the electronic design of interest illustrated in FIGS. 4A-E. Any element in this strongly connected component 460 may be selected as the index of data structure with total dominance in some embodiments. In some of these embodiments, a timing model associated with any of the 402, 404, 406, and 408 may be identified into the reduced set of timing models for subsequent timing analyses of the electronic design represented in FIGS. 4A-E due to the total dominance.

FIG. 4H illustrates an example of an adjacency data structure that may be used in determining dominance relations in one or more embodiments. More specifically, FIG. 4H illustrates an example where three strongly connected components (first, second, and third SCC or strongly connected component) are identified for a plurality of waveform data structures of a plurality of timing models with more than three timing models. Each entry in the array indicates a dominance relation. For example, A[2,3] has the value of "1" that indicates the second SCC dominates the third SCC. It shall be noted that the diagonal entries (A[1,1], A[2,2], and A[3,3]) have the value "0" in FIG. 4H. Because each strongly connected component is considered as dominating itself and may thus have either the value "1" as shown in FIG. 4G or the value "0" as shown in FIG. 4H.

FIG. 6 illustrates some examples of reducing timing models with respect to different tolerances in one or more embodiments. More specifically, FIG. 6 includes different numbers of timing models for a cell having one output port and eight inputs ports. There is a total of twenty-seven (27) timing models for each arc without any application of the techniques to reduce the total number of timing models for this particular cell. With the application of the techniques described herein, the table in FIG. 6 includes the numbers of timing models after processing these twenty-seven timing models with different tolerance values.

As it may be seen from FIG. 6, the number of timing models generally increases with decreasing tolerance values because a larger tolerance is capable of accommodating larger differences between the corresponding entries in the waveform tables. Nonetheless, FIG. 6 also demonstrates the techniques described herein greatly reduce the total number of timing models needed for performing timing analyses while providing equivalent or identical coverage with identical or equivalent accuracy even with a small tolerance value of 0.1 ps.

One of the advantages of these techniques described herein is the reduction of the total number of timing models and hence the net savings in runtime. Assuming a directed graph representing an electronic design or a portion thereof includes N vertices and M edges, these techniques need approximately or exactly an order of $N^2$ ($O(N^2)$) operations, and the Tarjan's algorithm needs approximately or exactly an order of $O(N+M)$ operations. Because the number of edges (M) is smaller than the square of the number of vertices (N) divided by 2 (i.e., $N^2/2$), the complexity of these techniques is $O(N^2)$. Therefore, the number of operations needed for these techniques described herein is approximately or exactly proportional to the square of the total number of timing models; and the reduction of the total number of timing models hence reduces the runtime as well as the correlated computation resources.

These techniques described herein also do not negatively influence the correctness or optimality of the analyses. For a strongly connected component, each pair of vertices (v, u) has a connecting path in both directions. Therefore, v dominates u, and u dominates v at the same time (or u and v dominate each other). As a result, waveforms in the output waveform data structures corresponding to such vertices are close to each other with an identified tolerance value. Consequently, all vertices from the strongly connected component are similar with respect to the identified tolerance, and any vertex may thus be selected as a solution. Hence, a strongly connected component may be replaced with a representative vertex.

In addition, for a condensation graph with a set D of strongly connected components having zero input valency or zero input degree, there exists a topologically sorted order for the condensation graph because the condensation graph has no cycles. Therefore, the set D of strongly connected components with zero input valency or zero input degree (e.g., first level of topologically sorted graph) will dominate all the other strongly connected components; and this dominance relation hence proves the correctness of various techniques described herein. Therefore, if an element of D is removed from the solution, this removed element will not be dominated by any other element because all elements of the set D have zero input valency or zero input degree. Consequently, a new set will not be a correct solution. This proves the optimality of various techniques described herein in some embodiments.

System Architecture Overview

Figure 7:
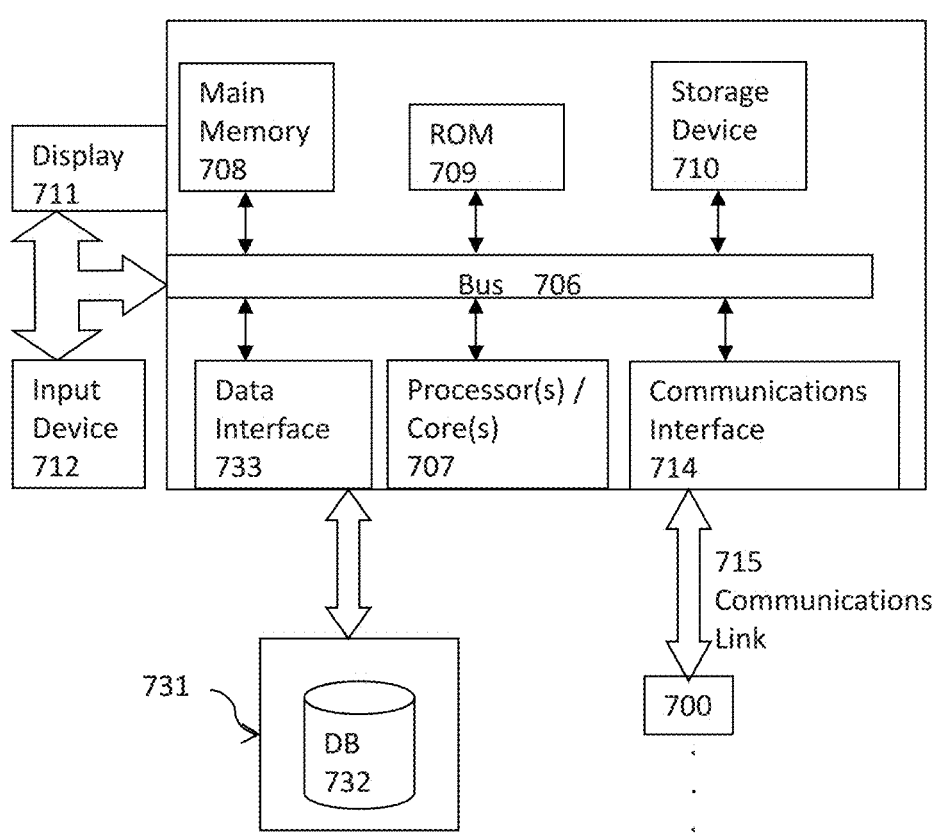
FIG. 7 illustrates a computerized system on which a method for enhancing timing analyses with reduced timing libraries for electronic designs may be implemented.

FIG. 7 illustrates a block diagram of an illustrative computing system 700 suitable for enhancing timing analyses with reduced timing libraries for electronic designs as described in the preceding paragraphs with reference to various figures. Computer system 700 includes a bus 806 or other communication module for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control (not shown).

According to one embodiment, computing system 700 performs specific operations by one or more processor or processor cores 707 executing one or more sequences of one or more instructions contained in system memory 708. Such instructions may be read into system memory 708 from another computer readable/usable storage medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 707, where the one or more processors, one or more processor cores, or combination thereof executes one or more threads. For example, various acts of determination, compression, decompression, etc. may be performed by one or more modules (e.g., one or more modules described in FIG. 1) including or functioning in tandem with one or more processors, one or more processor cores, or combination thereof.

A modules described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of modules.

A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs. To the extent that a module includes a piece of software, the software is stored in a non-transitory computer accessible storage medium such as computer memory.

The term "computer readable storage medium" or "computer usable storage medium" as used herein refers to any non-transitory medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, i.e., application code, through communication link 715 and communication interface 714. Received program code may be executed by processor 707 as it is received, and/or stored in disk drive 710, or other non-volatile storage for later execution. In an embodiment, the computing system 700 operates in conjunction with a data storage system 731, e.g., a data storage system 731 that includes a database 732 that is readily accessible by the computing system 700. The computing system 700 communicates with the data storage system 731 through a data interface 733. A data interface 733, which is coupled with the bus 706, transmits and receives electrical, electromagnetic or optical signals that include data streams representing various types of signal information, e.g., instructions, messages and data. In embodiments of the invention, the functions of the data interface 733 may be performed by the communication interface 714.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for enhancing timing analyses with reduced timing libraries for electronic designs, comprising:
    determining dominance relations for a plurality of timing models based in part or in whole upon one or more waveform-based criteria generated with a plurality of waveforms for performing one or more timing analyses on an electronic design or a portion thereof;
    generating and storing a dominance adjacency data structure at a first location in a non-transitory computer accessible storage medium based in part or in whole the dominance relations;
    reducing, at a transform module that is stored at least partially in memory and coupled with a micro-processor of a computing system, the plurality of timing models into a reduced set of timing models at least by providing the dominance adjacency data structure as an input to a transformation and by transforming the dominance adjacency data structure with the transformation into the reduced set of timing models; and
    implementing the electronic design or the portion thereof based in part or in whole upon results of the one or more timing analyses with at least the reduced set of timing models.

2. The computer implemented method of claim 1, further comprising:
    identifying the plurality of timing models from characterization results of the electronic design or the portion thereof having a plurality of inputs; and
    generating timing analysis results at least by performing the one or more timing analyses with the reduced set of timing models.

3. The computer implemented method of claim 1, further comprising:
    identifying a plurality of data structures from the plurality of timing models; and
    generating a first matrix based in part or in whole upon the plurality of timing models.

4. The computer implemented method of claim 3, wherein a timing model of the plurality of timing models includes an output waveform data structure including output waveform data for the electronic design or the portion thereof.

5. The computer implemented method of claim 3, further comprising:
    setting diagonal entries of the first matrix to a first value indicative of self-dominance of the plurality of timing models; and
    setting non-diagonal entries of the first matrix to the first value or a second value based in part or in whole upon the dominance relations for the plurality of timing models, the second value indicative of a first timing model not dominating a second timing model.

6. The computer implemented method of claim 5, further comprising:
    identifying a first output waveform from a first timing model and a second output waveform from a second timing model; and
    aligning the first waveform with the second waveform based in part or in whole upon first delay data of the first timing model and second delay data of the second timing data.

7. The computer implemented method of claim 5, further comprising:
    identifying one or more dominance criteria based in part or in whole upon a plurality of waveforms of the plurality of timing models, rather than upon slew and/or delay data, for determining the dominance relations.

8. The computer implemented method of claim 7, further comprising:
    comparing the first timing model and the second timing model based in part or in whole upon the one or more dominance criteria; and
    generating the dominance relations based in part or in whole upon results of comparing the first and second timing models.

9. The computer implemented method of claim 8, further comprising:
    identifying a tolerance value; and
    comparing the first timing model and the second timing model based further in part upon the tolerance value.

10. The computer implemented method of claim 1, further comprising:
    receiving or generating a directed graph based in part or in whole upon the dominance adjacency data structure; and
    identifying and storing a plurality of strongly connected components from the directed graph at a second location of a non-transitory computer accessible storage medium based in part or in whole upon unique indices and/or low-link indices of a plurality of vertices in the directed graph.

11. The computer implemented method of claim 10, further comprising:
    generating and storing a condensation graph at a third location of a non-transitory computer accessible storage medium at least by transforming the directed graph into the condensation graph using at least the plurality of strongly connected components.

12. The computer implemented method of claim 11, further comprising:
    identifying one or more vertices having zero input valency or zero input degree in the condensation graph; and
    generating the reduced set of timing models based in part or in whole upon the one or more vertices having the zero input valency or zero input degree.

13. A system for enhancing formal verification with counter acceleration for electronic designs, comprising:

one or more modules, at least one of which is stored in part or in whole in memory and comprises at least one processor including one or more processor cores executing one or more threads in a computing system;

a non-transitory computer accessible storage medium storing thereupon program code that includes a sequence of instructions that, when executed by the at least one processor, causes the at least one processor at least to:

determine dominance relations for a plurality of timing models based in part or in whole upon one or more waveform-based criteria generated with a plurality of waveforms for performing one or more timing analyses on an electronic design or a portion thereof;

generate and store a dominance adjacency data structure at a first location in a non-transitory computer accessible storage medium based in part or in whole the dominance relations;

reduce, at a transform module that is stored at least partially in memory and coupled with a micro-processor of a computing system, the plurality of timing models into a reduced set of timing models at least by providing the dominance adjacency data structure as an input to a transformation and by transforming the dominance adjacency data structure with the transformation into the reduced set of timing models; and implementing the electronic design or the portion thereof based in part or in whole upon results of the one or more timing analyses with at least the reduced set of timing models.

14. The system of claim 11, wherein the program code includes the sequence of instructions that, when executed by the at least one processor, further cause the at least one processor to:

receive or generate a directed graph based in part or in whole upon the dominance adjacency data structure; and identify and store a plurality of strongly connected components from the directed graph at a second location of a non-transitory computer accessible storage medium based in part or in whole upon unique indices and/or low-link indices of a plurality of vertices in the directed graph.

15. The system of claim 14, wherein the program code includes the sequence of instructions that, when executed by the at least one processor, further cause the at least one processor to:

generate and store a condensation graph at a third location of a non-transitory computer accessible storage medium by transforming the directed graph into the condensation graph using at least the plurality of strongly connected components.

16. The system of claim 15, wherein the program code includes the sequence of instructions that, when executed by the at least one processor, further cause the at least one processor to:

identify one or more vertices having zero input valency or zero input degree in the condensation graph; and generate the reduced set of timing models based in part or in whole upon the one or more vertices having the zero input valency or zero input degree.

17. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for enhancing timing analyses with reduced timing libraries for electronic designs, the set of acts comprising:

determining dominance relations for a plurality of timing models based in part or in whole upon one or more waveform-based criteria generated with a plurality of waveforms for performing one or more timing analyses on an electronic design or a portion thereof;

generating and storing a dominance adjacency data structure at a first location in a non-transitory computer accessible storage medium based in part or in whole the dominance relations;

reducing, at a transform module that is stored at least partially in memory and coupled with a micro-processor of a computing system, the plurality of timing models into a reduced set of timing models at least by providing the dominance adjacency data structure as an input to a transformation and by transforming the dominance adjacency data structure with the transformation into the reduced set of timing models; and implementing the electronic design or the portion thereof based in part or in whole upon results of the one or more timing analyses with at least the reduced set of timing models.

18. The article of manufacture of claim 16, the set of acts further comprising:

identifying a plurality of data structures from the plurality of timing models; and generating a first matrix based in part or in whole upon the plurality of timing models.

19. The article of manufacture of claim 18, the set of acts further comprising at least one of:

setting diagonal entries of the first matrix to a first value indicative of self-dominance of the plurality of timing models;

setting non-diagonal entries of the first matrix to the first value or a second value based in part or in whole upon the dominance relations for the plurality of timing models, the second value indicative of a first timing model not dominating a second timing model;

identifying a first output waveform from a first timing model and a second output waveform from a second timing model; and aligning the first waveform with the second waveform based in part or in whole upon first delay data of the first timing model and second delay data of the second timing data.

20. The article of manufacture of claim 19, the set of acts further comprising at least one of:

identifying one or more dominance criteria based in part or in whole upon a plurality of waveforms of the plurality of timing models, rather than upon slew and/or delay data, for determining the dominance relations;

comparing the first timing model and the second timing model based in part or in whole upon the one or more dominance criteria;

generating the dominance relations based in part or in whole upon results of comparing the first and second timing models;

identifying a tolerance value; and comparing the first timing model and the second timing model based further in part upon the tolerance value.

* * * * *